(12) United States Patent
Gan

(10) Patent No.: US 10,161,998 B2
(45) Date of Patent: Dec. 25, 2018

(54) TEST LEAD WIRE STRUCTURE AND TEST APPARATUS

(71) Applicant: SHENZHEN CHINA STAR OPTOELECTRONICS TECHNOLOGY CO., LTD., Shenzhen, Guangdong (CN)

(72) Inventor: Qiming Gan, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 201 days.

(21) Appl. No.: 14/771,048

(22) PCT Filed: Aug. 4, 2015

(86) PCT No.: PCT/CN2015/086025
§ 371 (c)(1),
(2) Date: Aug. 27, 2015

(87) PCT Pub. No.: WO2017/015979
PCT Pub. Date: Feb. 2, 2017

(65) Prior Publication Data
US 2017/0023641 A1   Jan. 26, 2017

(30) Foreign Application Priority Data

Jul. 24, 2015   (CN) .......................... 2015 1 0439532

(51) Int. Cl.
*G01R 31/28* (2006.01)
*G09F 9/00* (2006.01)
*G02F 1/1345* (2006.01)

(52) U.S. Cl.
CPC ....... *G01R 31/2884* (2013.01); *G02F 1/1345* (2013.01); *G09F 9/00* (2013.01)

(58) Field of Classification Search
None
See application file for complete search history.

(56) References Cited

U.S. PATENT DOCUMENTS

| 7,692,376 B2 | 4/2010 | Lifka et al. |
| 9,000,797 B2 | 4/2015 | Wen |
| 9,128,169 B2 | 9/2015 | Wu et al. |
| 2015/0317927 A1 | 11/2015 | Wu |

FOREIGN PATENT DOCUMENTS

| CN | 1685510 A | 10/2005 |
| CN | 102831852 A | 12/2012 |
| JP | 2007140378 A | * 6/2007 |
| JP | 4886278 B2 | 2/2012 |
| TW | 201403167 A | 1/2014 |

OTHER PUBLICATIONS

English Translation of JP 2007-140378 A.*

* cited by examiner

*Primary Examiner* — Paresh Patel
(74) *Attorney, Agent, or Firm* — Ladas & Parry LLP

(57) ABSTRACT

A test lead wire structure for connecting signal lines in a display device with test lines outside, includes a first insulating layer, a second insulating layer, first lead wires, and second lead wires. The projections of the first lead wires on the second insulating layer and the projections of the second lead wires on the second insulating layer are alternately disposed. During the cutting operation, short circuits are effectively prevented from occurring between the different test lead wires.

13 Claims, 2 Drawing Sheets

TEST LEAD WIRE STRUCTURE AND TEST APPARATUS

FIELD OF THE INVENTION

The present invention relates to the field of tests, and particularly to a test lead wire structure and a test apparatus.

BACKGROUND OF THE INVENTION

With the development of technology, people have more demands for display technology. Before leaving factories, all conventional display devices undergo multiple tests to meet the demands.

FIG. 1A is a structural schematic diagram of a conventional test lead wire structure. FIG. 1B is a sectional view along the A-A' section line on FIG. 1A. The display panel is labeled as "11", the signal lines are labeled as "12", the test lead wires are labeled as "13", the test lines are labeled as "14", and the test signal generating device is labeled as "15".

The signal lines 12 and the test lead wires 13 are formed in the manufacturing process of the display device. Each signal line 12 corresponds to one test lead wires 13. The test signal generating device 15 transmits test signals to the signal lines 12 via the test lead wires 13 for performing display tests on the display panel 11.

In order to facilitate disposing signal terminals, the test lead wires 13 are cut off after the tests of the display panel 11. However, since the resolution of the display panel 11 is becoming higher, the intervals between the test lead wires 13 are also becoming narrower. During the cutting operation, debris generated by cutting may easily cause the short circuits between the different test lead wires 13.

Therefore, it is necessary to provide a test apparatus and a test lead wire structure for resolving the problem of the prior art.

SUMMARY OF THE INVENTION

An object of the present invention is to provide a test lead wire structure and a test apparatus effectively preventing short circuits from occurring between neighboring test lead wires during a cutting operation, in order to resolve the technical problem of the short circuits occurring between the different test lead wires in the test lead wire structure and the test apparatus during the cutting operation.

To solve the problem above, the technical solutions of the present invention are provided as follows:

A test lead wire structure is provided in an embodiment of the present invention for connecting signal lines in a display device with test lines outside, which includes:
  a first insulating layer;
  a second insulating layer disposed on the first insulating'layer;
  first lead wires disposed between the first insulating layer and the second insulating layer; and
  second lead wires disposed on the second insulating layer;
  wherein the projections of the first lead wires on the second insulating layer and the projections of the second lead wires on the second insulating layer are alternately disposed;
  wherein intervals between the adjacent first lead wires are greater than or equal to a preset safety value, and intervals between the adjacent second lead wires are greater than or equal to the preset safety value;
  wherein an end of the second lead wire is directly connected with the signal line, and the other end of the second lead wire is directly connected with the test line.

The test lead wire structure in the present invention includes first through holes disposed on the second insulating layer for leading the first lead wires to the second insulating layer, so as to connect the first lead wires with the signal lines.

The test lead wire structure in the present invention includes second through holes disposed on the second insulating layer for leading the first lead wires to the second insulating layer, so as to connect the first lead wires with the test lines.

In the test lead wire structure in the present invention, the first through holes and the second through holes are respectively disposed on two ends of the first lead wires.

A test lead wire structure is provided in an embodiment of the present invention for connecting signal lines in a display device with test lines outside, which includes:
  a first insulating layer;
  a second insulating layer disposed on the first insulating layer;
  first lead wires disposed between the first insulating layer and the second insulating layer; and
  second lead wires disposed on the second insulating layer;
  wherein the projections of the first lead wires on the second insulating layer and the projections of the second lead wires on the second insulating layer are alternately disposed.

In the test lead wire structure in the present invention, intervals between the adjacent first lead wires are greater than or equal to a preset safety value.

In the test lead wire structure in the present invention, intervals between the adjacent second lead wires are greater than or equal to the preset safety value.

The test lead wire structure in the present invention includes first through holes disposed on the second insulating layer for leading the first lead wires to the second insulating layer, so as to connect the first lead wires with the signal lines.

The test lead wire structure in the present invention includes second through holes disposed on the second insulating layer for leading the first lead wires to the second insulating layer, so as to connect the first lead wires with the test lines.

In the test lead wire structure in the present invention, the first through holes and the second through holes are respectively disposed on two ends of the first lead wires.

In the test lead wire structure in the present invention, an end of each of the second lead wires is directly connected with one of the signal lines, and the other end of each of the second lead wires is directly connected with one of the test lines.

A testing apparatus is provided in an embodiment of the present invention, which includes:
  a test signal generating device for generating test signals; and
  a test lead wire structure for transmitting the test signals to signal lines in a corresponding display device by connecting test lines with the test signal generating device;
  wherein the test lead wire structure includes:
    a first insulating layer;
    a second insulating layer disposed on the first insulating layer;
    first lead wires disposed between the first insulating layer and the second insulating layer; and second lead wires disposed on the second insulating layer;

wherein the projections of the first lead wires on the second insulating layer and the projections of the second lead wires on the second insulating layer are alternately disposed.

The test lead wire structure in the present invention includes a cut mark disposed on the test lead wire structure to facilitate separating the signal line and the test wire after a test is complete.

In the test lead wire structure in the present invention, intervals between the adjacent first lead wires are greater than or equal to a preset safety value.

In the test lead wire structure in the present invention, intervals between the adjacent second lead wires are greater than or equal to the preset safety value.

The test lead wire structure in the present invention includes first through holes disposed on the second insulating layer for leading the first lead wires to the second insulating layer, so as to connect the first lead wires with the signal lines.

The test lead wire structure in the present invention includes second through holes disposed on the second insulating layer for leading the first lead wires to the second insulating layer, so as to connect the first lead wires with the test lines.

In the test lead wire structure in the present invention, the first through holes and the second through holes are respectively disposed on two ends of the first lead wires.

In the test lead wire structure in the present invention, an end of each of the second lead wires is directly connected with one of the signal lines, and the other end of each of the second lead wire is directly connected with one of the test lines.

Compared with conventional test lead wire structures and test apparatuses, the test lead wire structure and the test apparatus of the present invention effectively prevent the short circuits from occurring between the different test lead wires during the cutting operation by disposing the first lead wires and the second leads located on the different layers, in order to resolve the technical problem of the short circuits occurring between the different test lead wires in the conventional test lead wire structure and the test apparatus during the cutting operation.

In order to make the present invention be clearly comprehensible, the preferred embodiments are provided and described below with the accompanying drawings.

DETAILED DESCRIPTION OF THE PREFERRED EMBODIMENTS

Figure 1A:
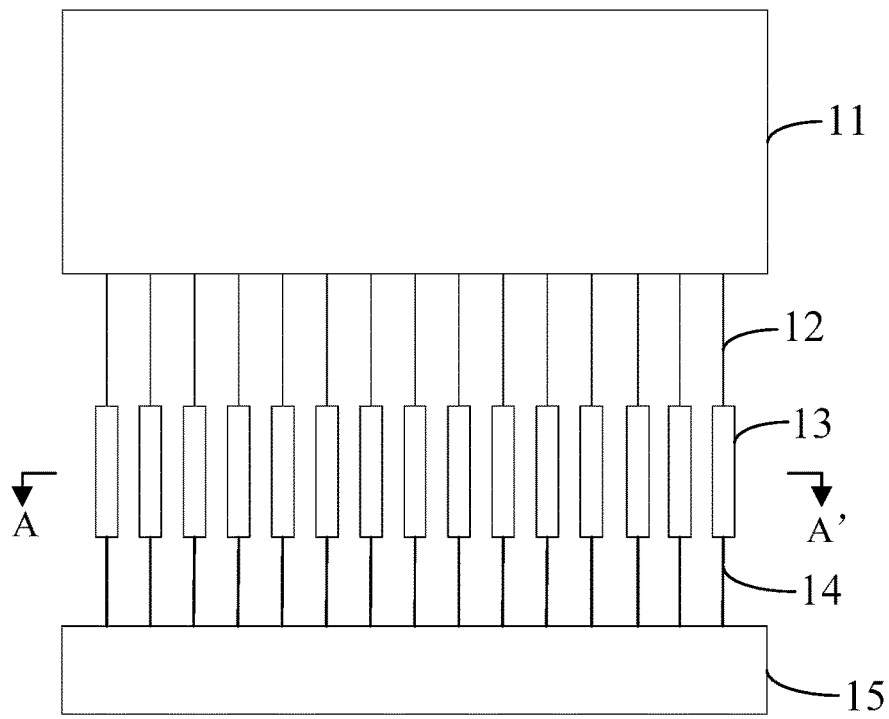
FIG. 1A is a structural schematic diagram of a test lead wire structure in a prior art.
Figure 1B:
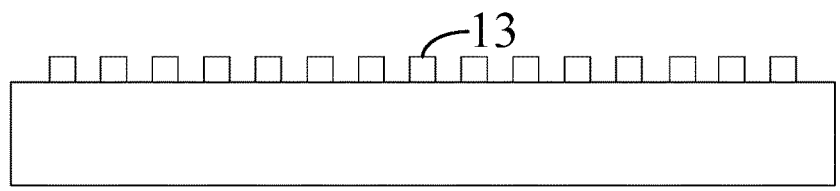
FIG. 1B is a sectional view taken along the section line A-A' in FIG. 1A.

The following description of the embodiments with reference to the accompanying drawings is used to illustrate particular embodiments of the present invention. The directional terms referred in the present invention, such as "upper", "lower", "front", "after", "left", "right", "inner", "outer", "side surface", etc. are only directions with regard to the accompanying drawings. Therefore, the directional terms used for describing and illustrating the present invention are not intended to limit the present invention.

In the drawings, units with similar structures are indicated by the same reference number.

Figure 2A:
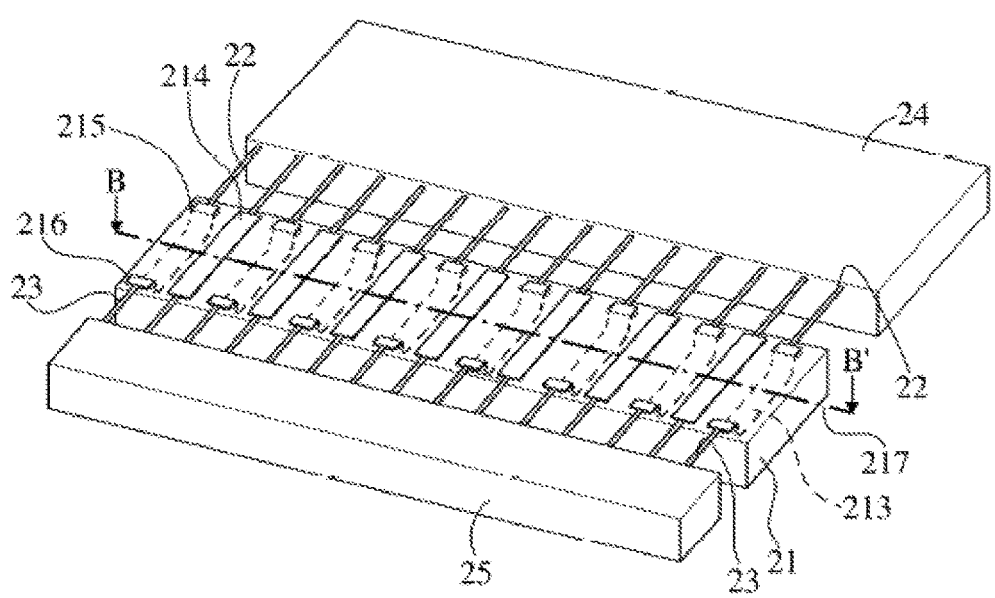
FIG. 2A is a structural schematic diagram of a test lead wire structure according to a preferred embodiment in the present.
Figure 2B:
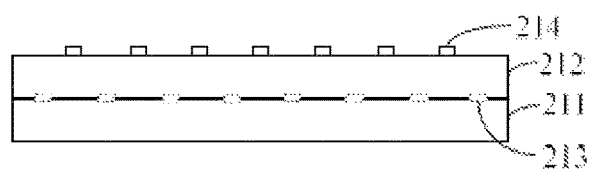
FIG. 2B is a sectional view taken along the section line A-A' in FIG. 2A.

Please refer to FIGS. 2A and 2B. FIG. 2A is a schematic diagram of a test lead wire structure according to a preferred embodiment of the present invention. FIG. 2B is a sectional view taken along the section line A-A' in FIG. 2A. In the preferred embodiment, the test lead wire structure 21 is used for connecting signal lines 22 in a display device with test lines 23 outside. The test lead wire structure 21 includes a first insulating layer 211, a second insulating layer 212, a first lead wires 213 (test lead wires), and a second lead wires 214 (test lead wires). The second insulating layer 212 is disposed on the first insulating layer 211, the first lead wires 213 is disposed between the first insulating layer 211 and the second insulating layer 212, and the second lead wires 214 are disposed on the second insulating layer 212. The projections of the first lead wires 213 on the second insulating layer 212 and the projections of the second lead wires 214 on the second insulating layer 212 are alternately disposed.

The test lead wire structure 21 further includes first through holes 215 and second through holes 216. The first through holes 215 are disposed on the second insulating layer 212 for leading the first lead wires 213 to the second insulating layer 212, so as to connect the first lead wires 213 with the signal lines 22. The second through holes 216 are disposed on the second insulating layer 212 for leading the first lead wires 213 to the second insulating layer 212, so as to connect the first lead wires 213 with the test lines 23. The first through holes 215 and the second through holes 216 are respectively disposed on two ends of the first lead wires 213. One end of each of the second lead wire 214 is directly connected with one of the signal lines 22, and the other end of each of the second lead wire 214 is directly connected one of the test lines 23.

When the test lead wire structure 21 of the preferred embodiment is used for testing a display device, the test signal generating device 25 outside is connected with the test lead wire structure 21 via the test lines 23, so that the test signals generated by the test signal generating device 25 can be inputted to the signal lines 22 of the display panel 24 through the first lead wires 213 and the second lead wires 214 of the test lead wire structure 21. The second lead wires 214 are directly connected with the signal lines 22 and the test lines 23. The first lead wires 213 are connected with the signal lines 22 via the first through holes 215, and connected with the test lines 23 via the second through holes 216 for performing the corresponding screen display test.

After the tests of the display panel 24 are complete, the signal lines 213 and the test wires 214 are cut off via a cut mark 217 disposed on the test lead wire structure 21.

Since the intervals between the adjacent first lead wires 213 are greater than or equal to a preset safety value, and the intervals between the adjacent second lead wires 214 are greater than or equal to the preset safety value, therefore, short circuits do not occur between the different test lead wires during the cutting operation.

Furthermore, since the first lead wires 213 and the second lead wires 214 are disposed on the different planes, the distance between the projections of the first lead wires 213 on the second insulating layer 212 and the projections of the second lead wires 214 on the second insulating layer 212 can be less than the present safety value. Hence, more test lead wires can be disposed in the same areas for facilitating the display tests of the high-resolution display devices.

These steps complete the display test process of the test lead wire structure 21 of the preferred embodiment.

The test lead wire structure and the test apparatus of the preferred embodiment effectively prevent the short circuits from occurring between the different test lead wires during the cutting operation by disposing the first lead wires and the second leads located on the different layers.

The present invention also provides a test apparatus, which includes a test signal generating device and a test lead wire structure. The test signal generating device is used for generating test signals, and the test lead wire structure is used for transmitting the test signals to signal lines in a corresponding display device by connecting test lines with the test signal generating device. The test lead wire structure includes a first insulating layer, a second insulating layer, first lead wires, and second lead wires. The second insulating layer is disposed on the first insulating layer, the first lead wires are disposed between the first insulating layer and the second insulating layer, and the second lead wires are disposed on the second insulating layer. The projections of the first lead wires on the second insulating layer and the projections of the second lead wires on the second insulating layer are alternately disposed.

The testing apparatus further includes first through holes and second through holes. The first through holes are disposed on the second insulating layer for leading the first lead wires to the second insulating layer, so as to connect the first lead wires with the signal lines. The second through holes are disposed on the second insulating layer for leading the first lead wires to the second insulating layer, so as to connect the first lead wires with the test lines. The first through holes and the second through holes are respectively disposed on two ends of the first lead wires. One end of each of the second lead wires is directly connected with one of the signal lines, and the other end of each of the second lead wires is directly connected one of the test lines.

Preferably, the test apparatus of the present preferred embodiment further includes a cut mark, which is disposed on the test lead wire structure to facilitate separating the signal line and the test wire after a test is complete.

The specific operation principle of the test apparatus of the preferred embodiment is the same as to or similar to the description of the aforementioned test lead wire structure of the preferred embodiment. For details, please refer to the relative description of the aforementioned test lead wire structure of the preferred embodiment.

The test lead wire structure and the test apparatus of the present invention effectively prevent the short circuits from occurring between the different test lead wires during the cutting operation by disposing the first lead wires and the second leads located on the different layers, in order to resolve the technical problem of the short circuits occurring between the different test lead wires in the conventional test lead wire structure and the test apparatus during the cutting operation.

In summary, although the preferred embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A test lead wire structure for connecting signal lines in a display device with test lines outside, comprising:
a first insulating layer;
a second insulating layer, disposed on the first insulating layer;
first lead wires, disposed between the first insulating layer and the second insulating layer;
second lead wires, disposed on the second insulating layer;
first through holes, disposed on the second insulating layer, and leading the first lead wires to the second insulating layer, wherein the first lead wires pass through the first through holes, and are directly connected with the signal lines through the first through holes; and
second through holes, disposed on the second insulating layer, and leading the first lead wires to the second insulating layer, wherein the first lead wires pass through the second through holes, and are directly connected with the test lines through the second through holes;
wherein projections of the first lead wires on the second insulating layer and projections of the second lead wires on the second insulating layer are alternately disposed;
wherein an interval between the adjacent first lead wires is greater than or equal to a preset safety value, and an interval between the adjacent second lead wires is greater than or equal to the preset safety value;
wherein an end of the second lead wire is directly connected with the signal line, and the other end of the second lead wire is directly connected with the test line.

2. The test lead wire structure as claimed in claim 1, wherein the first through holes and the second through holes are respectively disposed on two ends of the first lead wires.

3. A test lead wire structure for connecting signal lines in a display device with test lines outside, comprising:
a first insulating layer;
a second insulating layer, disposed on the first insulating layer;
first lead wires, disposed between the first insulating layer and the second insulating layer;
second lead wires, disposed on the second insulating layer;
first through holes, disposed on the second insulating layer, and leading the first lead wires to the second insulating layer, wherein the first lead wires pass through the first through holes, and are directly connected with the signal lines through the first through holes; and
second through holes, disposed on the second insulating layer, and leading the first lead wires to the second insulating layer, wherein the first lead wires pass through the second through holes, and are directly connected with the test lines through the second through holes;
wherein projections of the first lead wires on the second insulating layer and projections of the second lead wires on the second insulating layer are alternately disposed.

4. The test lead wire structure as claimed in claim 3, wherein an interval between the adjacent first lead wires is greater than or equal to a preset safety value.

5. The test lead wire structure as claimed in claim 3, wherein an interval between the adjacent second lead wires is greater than or equal to the preset safety value.

6. The test lead wire structure as claimed in claim 3, wherein the first through holes and the second through holes are respectively disposed on two ends of the first lead wires.

7. The test lead wire structure as claimed in claim 3, wherein an end of each of the second lead wires is directly connected with one of the signal lines, and the other end of each of the second lead wires is directly connected with one of the test lines.

8. A testing apparatus, comprising
a test signal generating device, for generating test signals; and
a test lead wire structure, for transmitting the test signals to signal lines in a corresponding display device by connecting test lines with the test signal generating device,
the test lead wire structure comprising:
a first insulating layer;
a second insulating layer, disposed on the first insulating layer;
first lead wires, disposed between the first insulating layer and the second insulating layer;
second lead wires, disposed on the second insulating layer;
first through holes, disposed on the second insulating layer, and leading the first lead wires to the second insulating layer, wherein the first lead wires pass through the first through holes, and are directly connected with the signal lines through the first through holes; and
second through holes, disposed on the second insulating layer, and leading the first lead wires to the second insulating layer, wherein the first lead wires pass through the second through holes, and are directly connected with the test lines through the second through holes;
wherein projections of the first lead wires on the second insulating layer and projections of the second lead wires on the second insulating layer are alternately disposed.

9. The testing apparatus as claimed in claim 8, further comprising:
a cut mark, disposed on the test lead wire structure to facilitate separating the signal line and the test wire after a test is complete.

10. The testing apparatus as claimed in claim 8, wherein an interval between the adjacent first lead wires is greater than or equal to a preset safety value.

11. The testing apparatus as claimed in claim 8, wherein an interval between the adjacent second lead wires is greater than or equal to the preset safety value.

12. The testing apparatus as claimed in claim 8, wherein the first through holes and the second through holes are respectively disposed on two ends of the first lead wires.

13. The testing apparatus as claimed in claim 8, wherein an end of each of the second lead wires is directly connected with one of the signal lines, and the other end of each of the second lead wire is directly connected with one of the test lines.

* * * * *